United States Patent [19]

Braymen et al.

[11] Patent Number: 5,011,568

[45] Date of Patent: Apr. 30, 1991

[54] USE OF SOL-GEL DERIVED TANTALUM OXIDE AS A PROTECTIVE COATING FOR ETCHING SILICON

[75] Inventors: Steven D. Braymen; Bradley A. Paulson, both of Ames; Kenneth D. Goedken, Dubuque, all of Iowa

[73] Assignee: Iowa State University Research Foundation, Inc., Ames, Iowa

[21] Appl. No.: 535,595

[22] Filed: Jun. 11, 1990

[51] Int. Cl.$^5$ ............................................. H01L 21/306
[52] U.S. Cl. ...................... 156/647; 156/653; 156/657; 156/662; 437/228; 437/225; 310/324
[58] Field of Search ............... 437/225, 226, 227, 228; 156/644, 662, 645, 647; 310/321, 324, 340

[56] References Cited

U.S. PATENT DOCUMENTS

| | | | |
|---|---|---|---|
| 3,791,861 | 2/1974 | Sundahl, Jr. | 117/213 |
| 4,131,985 | 1/1979 | Greenwood et al. | 437/227 |
| 4,310,569 | 1/1982 | Harrington | 427/89 |
| 4,325,984 | 4/1982 | Galfo et al. | 427/38 |
| 4,368,220 | 1/1983 | Eldridge et al. | 427/225.4 |
| 4,436,580 | 3/1984 | Boyd et al. | 156/636 |
| 4,456,850 | 6/1984 | Inoue et al. | 310/324 |
| 4,618,397 | 10/1986 | Shimizu et al. | 156/647 |
| 4,642,508 | 2/1987 | Suzuki et al. | 310/321 |
| 4,719,383 | 1/1988 | Wang et al. | 310/324 |
| 4,721,938 | 4/1988 | Stevenson | 156/644 |
| 4,744,861 | 5/1988 | Matsunaga et al. | 156/643 |
| 4,765,864 | 8/1988 | Holland et al. | 437/228 |
| 4,801,399 | 1/1989 | Clark et al. | 252/315.01 |
| 4,851,080 | 7/1989 | Howe et al. | 156/647 |
| 4,890,370 | 1/1990 | Fukuda et al. | 437/228 |

*Primary Examiner*—Brian E. Hearn
*Assistant Examiner*—Trung Dang
*Attorney, Agent, or Firm*—Zarley, McKee, Thomte, Voorhees & Sease

[57] ABSTRACT

Thin film resonators are prepared by an improved process involving coating a patterned wafer with a sol-gel derived tantalum (V) oxide passivating film so that the circuitry can be protected from etching chemicals during the etching of vias through the back of the silicon wafer.

4 Claims, No Drawings

USE OF SOL-GEL DERIVED TANTALUM OXIDE AS A PROTECTIVE COATING FOR ETCHING SILICON

BACKGROUND OF THE INVENTION

Sol-gel technology involves the preparation of ceramics and glasses by hydrolysis and condensation of metal oxide precursors (usually organometallic compounds) in solution. In general, this approach reduces the sintering temperature required to obtain the metal oxide ceramic. Furthermore, sol-gel technology is an economical method of fabricating thin films. However, the subsequent processing after application of the sol-gel thin film can involve failures, cracked films, pinholes, etc.

Vapor deposition methods, such as evaporation, sputtering, and chemical vapor deposition (CVD), are methods commonly used in fabricating semiconductor devices, including thin film resonator devices such as resonators, filters, oscillators, etc. However, sol-gel techniques can lead to more conformal coverage of the substrate than can be obtained by vapor deposition methods.

According to a typical method for fabricating, for example, a semiconductor device, a thin film of aluminum is deposited onto a layer of silicon dioxide formed over a silicon wafer substrate. The aluminum film is masked by photoresist and then etched in a plasma to form an electrode or conductor pattern.

In the step in the fabrication of a semiconductor device involving formation of a conductor geometry by etching a thin layer of aluminum or aluminum alloy, the alloy covers an underlying layer of the semiconductor device. The underlying layer may be silicon dioxide. The conductor pattern to be etched from the aluminum is defined by a photoresist masking layer formed over the aluminum such that only regions unmasked by the photoresist will be etched. To achieve satisfactory results, it is required that the etching proceed only in the desired areas and that it not otherwise affect the integrity of the remaining portions of the layer.

Commonly, thin film resonator devices are produced by fabricating p+ membranes in the surface of the silicon wafer by means of boron diffusion into the wafer, followed by backside etching of vias through the bulk silicon wafer to the p+ membrane etch stop, and thereafter placing the desired circuitry over the membrane which is then removed. However, the use of + membranes in thin film resonator technology fabrication has a detrimental effect on the silicon substrate resulting in poor reproducability and low product yield. Moreover, when a boron p+ etch stop is used by depositing the same over a silicon dioxide surface grown on top of a silicon wafer, this must be followed by a deglazing sequence, after the etching in order to remove the resulting boro-silicate glass ($xB_2O_3 \cdot ySiO_2$).

The commonly used etch material used to etch the backside of the wafer is ethylenediamine-pyrocathechol-water (EDPW).

Since solutions of EDPW etch silicon at a rate much faster than that of silicon dioxide, a second oxidation is necessary to grow a new layer of thermal silicon dioxide on both the front and back of the wafer in preparation for backside lithography. Once the back of the wafer is patterned, the thermal silicon dioxide layer acts as a mask so that the vias can be etched through the bulk of the silicon wafer with a hot EDPW solution, with the etch stopping at the boron p+ membrane. However, as earlier stated, the high boron concentrations in the silicon crystal lattice lead to misfit dislocations which can not only be detrimental to the production of the active devices, but are also known to contribute to low yield and poor reproducability of the process.

Accordingly, it is a primary objective of the present invention to first build the devices on the silicon wafer, to then employ a sol-gel derived tantalum oxide film as a layer over the device, and to etch without using a p+ membrane. The result is the building of thin film resonator devices quicker, cheaper, of higher integrity, and of greater yield without the use of p+ membranes, by a process which allows etching of the backside vias as the final processing step.

The method and manner of accomplishing each of these objectives will become apparent from the detailed description of the invention which follows hereinafter.

SUMMARY OF THE INVENTION

In accordance with the process of this invention, thin film resonators are prepared by growing a thermal oxide on both sides of a silicon wafer, and thereafter fabricating a thin film resonator device on top of the wafer. This is followed by patterning the silicon dioxide on the backside of the wafer and applying a tantalum (V) oxide sol-gel to the top over the device. This is followed by curing of the tantalum oxide film and final etching of the silicon dioxide windows through the backside to the top silicon dioxide layer.

DETAILED DESCRIPTION OF THE INVENTION

The process of the present invention begins with a conventionally obtained silicon wafer of polycrystalline silicon material (100) wafer having a thickness of about 14 to about 22 mls. thick. A thermal oxide layer of silicon dioxide is grown on both sides of the wafer by use of conventional technology, for example, steam oxidation at 1000° C. for 20 minutes. As a result, a layer of silicon dioxide covers both sides of the wafer. Typical processing conditions for growing the thermal oxide layer are from 900° C. to 1100° C. for from about 5 minutes to about 24 hours. Either steam oxidation or dry oxidation may be used, with no preference for either. For further details of growing thermal oxide layers on silicon wafers, see Sze, *VLSI Technology*, Chapter 4, published by McGraw-Hill publication company.

After thermal oxide has been grown on both sides of the silicon wafer, in accordance with this invention, the next step involves fabricating a thin film resonator device on top of the wafer. The device grown can be filters, integrated oscillators, resonators, and it can be both active or passive devices such as transistors, amplifier devices, coils and filters. The precise device is not critical. Again, the details for growing these devices which may involve sandwiched layers of, for example, aluminum and aluminum nitride, etc., are depicted in the same Sze reference at chapter 9 on metalizations.

In the next step of the process of this invention, the backside of the wafer must be patterned so that the silicon dioxde windows on the backside line up with the devices on the top. Common patterning techniques involve photoresist masking such that only the regions unmasked by the photoresist will be etched in later steps. Patterning is a well-known technique and need not be described herein. For details, see the Sze reference chapter 7.

and water in ethanol. The conditions of producing the sol-gel are shown in table I below.

TABLE I

| Material | Properties | | | Reaction Conditions | | |
|---|---|---|---|---|---|---|
| | Density (g/cm$^3$) | m.p. (°C.) | M(OR)$_x$ (g) | Concentration (mole M$^{x+}$/1 EtOH) | Molar Ratios | |
| | | | | | (HNO$_3$/M$^{x+}$) | (H$_2$O/M$^{x+}$) |
| Ta$_2$O$_5$ | 8.2 | 1800 | 5.0 | 0.205 | 0.052 | 2.5 |

In accordance with the next step of the process of this invention, the device on top of the silicon wafer is protected by applying a protective layer of tantalum (V) oxide sol-gel to the top of the device. This allows all circuitry processing to be accomplished before etching the vias in the silicon wafer. As a result, there is a significant reduction in losses due to membrane breakage.

The tantalum oxide layer can be applied using routine sol-gel technology. In particular, the tantalum oxide is dissolved in a C$_1$ to C$_3$ alcohol or alkoxy alcohol such as 2-methoxyethanol to provide an alcohol complex. Often it is preferred to add trace amounts of nitric acid catalyst during the hydrolysis-condensation process. The sol is then applied to the wafer by one of several film forming processes such as a spinning process. For further details of spin process application of sol-gels, see Wolf, *Silicon Processing for the VLSI Era*. Vol. 1 at page 431–432. In particular, gel is applied to the wafer which is rotated by means of centrifugal force, the gel is uniformly spread over the wafer, and in this instance, since the device is already built, it is also spread over the device. Details of spin processing as used in one example of this invention are illustrated in the table below. However, it is to be emphasized that routine spin conditions are employed and that the process of this invention does not depend upon precise sol-gel conditions, but rather the sequence of steps of the overall process to avoid the use of p+membranes.

After the sol-gel is applied, it is cured to sinter the sol-gel into a continuous integrated ceramic film. Sol-gel sintering is by heating at temperatures typically within the range of 300° C. to 400° C. The important point is to stay below the melt temperature for aluminum, otherwise the device built on top of the wafer will be destroyed. Cure times to fully densify the layer at the temperatures expressed herein are generally up to about 1 hour.

In accordance with the last step of the process of this invention, etching occurs through the silicon dioxide windows with common etch chemicals such as a EDPW. The etch goes through the crystalline wafer up to the silicon dioxide layer on the top of the wafer. As is known, EDPW is mentioned by illustration only, and chemical etchants for silicon are numerous. For details of chemical etchants, see "Silicon as a Mechanical Material," Peterson, *Proceedings of the IEE*, Vol. 70, No. 5, May 1982, table II at page 424. It is unnecessary to name all known chemical etchants. They can include ethylenediamine-pyrocatechol, potassium hydroxide, sodium hydroxide, nitric acid, etc. Obviously, etching conditions will vary depending upon the chemical etchant employed. Typical conditions where EDPW and tantalum (V) oxide are depicted below. The following example is offered to further illustrate but not limit the process of the present invention.

Example

Sol-gels were produced through controlled hydrolysis of tantalum (V) oxide to dilute solution of nitric acid In order to take advantage of the properties of sol-gel derived films, the etching of the silicon wafers was done last. in this way, the processing is complete prior to the etching procedure. Once the vias are produced, no further processing is necessary, which eliminates the possibility of damaging the devices. The effect is to increase the yield of TFRs, while reducing equipment and material costs.

First, three-inch silicon wafers were cleaned and a 0.5 μm thermal SiO$_2$ film was grown. The thermal oxide has a density of 2.17 and adequately resists the corrosive EDPW solution during the etching of the vias through the bulk silicon wafer. The film on the back of the wafer is patterned as below described to allow the etching of the vias, while the film on the front of the wafer serves as an etch stop as the via passes through the wafer from the back.

The second step was to obtain the required device circuitry over the thermal oxide on the front of the wafer. Initially, a 0.25 μm film of aluminum was placed on the wafer by evaporation. The aluminum was patterned by coating the surface with photoresist, exposing it through a mask with UV light, developing the resist, and etching off the exposed aluminum with a phosphoric acid-acetic acid-nitric solution (PAN etch).

Once the metal layer was patterned, it was coated with the sol-gel film. One ml of the desired sol was applied to the static substrate, then spun at 3000 rpm for 40 seconds on a photoresist spinner, and the films were dried at 100° C for approximately 15 minutes. Since aluminum diffusion is significant at temperatures above 425° C., the films were cured at 400° C. in a muffle furnace for an hour. To reduce the likelihood of pinholes developing in the films, which would result in the etching of the material beneath, once the first layer had cooled, a second layer of the sol-gel was applied. The second layer was dried and cured under the same conditions. Application of additional layers led to the development of fissures in the film, which were preferentially attacked during the etching of the vias, effectively destroying both the protective and aluminum films.

With the device circuitry on the front of the wafers protected by metal oxide films, the back of the wafers were coated with photoresist and the desired via configurations were patterned into the thermal oxide on the back of the wafers. Upon completion of the backside lithography process, the wafers were placed in an EDPW solution and etched for approximately 4 hours at 115° C.

After the devices were completed, they were examined in detail. While there was some localized etching evident in the aluminum as a result of pinholes in the tantalum film, the bulk of the aluminum circuitry clearly survived the etching with EDPW. Routine adjusting viscosity of the sol and the processing conditions of the film can minimize the occurrence of pinholes. In particular, if the sol is multi-layered, less risk of pinholes occurs.

By eliminating the boron diffusion process to obtain p+ membranes, the process is more reproducible and the overall capital cost is drastically reduced. Furthermore, by coating the patterned metal with sol-gel derived tantalum oxide, the circuitry is protected during the EDPW etch, allowing the production of the membranes to be the last processing step. In this way, the fragile membranes do not have to withstand any subsequent processing resulting in a yield increase of the thin film resonator (TFR) devices.

What is claimed is:

1. A method of preparing thin film resonators, said method comprising:

growing a thermal oxide on both sides of a silicon wafer;

fabricating a thin film resonator device on top of said wafer; patterning the $SiO_2$ on the back of said wafer so that $SiO_2$ windows on the backside line up with the devices on top;

applying a $Ta_2O_3$ sol-gel to the top over said device;

curing the $Ta_2O_3$ film to condense the sol-gel to a ceramic film; thereafter etching through the $SiO_2$ windows with EDPW to the $SiO_2$ layer on the top.

2. The method of claim 1 wherein the thermal oxide is grown by steam oxidation.

3. The method of claim 1 wherein the sol-gel is cured at temperatures within the range of 300° C. to 400° C. for up 1.0 hours.

4. The method of claim 1 wherein etching is with EDPW.

* * * * *